US009831410B2

(12) United States Patent
Rinaldi et al.

(10) Patent No.: US 9,831,410 B2
(45) Date of Patent: Nov. 28, 2017

(54) UNIT FOR CONVERSION OF THERMAL ENERGY

(71) Applicant: C.R.F. Societa Consortile per Azioni, Orbassano (Turin) (IT)

(72) Inventors: Alex Rinaldi, Orbassano (IT); Silvano Sandri, Orbassano (IT); Andrea Perosino, Orbassano (IT)

(73) Assignee: C.R.F. Societa Consortile per Azioni, Orbassano (Turin) (IT)

( * ) Notice: Subject to any disclaimer, the term of this patent is extended or adjusted under 35 U.S.C. 154(b) by 0 days.

(21) Appl. No.: 15/338,571

(22) Filed: Oct. 31, 2016

(65) Prior Publication Data

US 2017/0133570 A1    May 11, 2017

(30) Foreign Application Priority Data

Nov. 6, 2015 (EP) .................................. 15193504

(51) Int. Cl.
*F01N 3/00* (2006.01)
*H01L 35/30* (2006.01)
(Continued)

(52) U.S. Cl.
CPC .............. *H01L 35/30* (2013.01); *F28F 9/001* (2013.01); *F28F 9/0226* (2013.01); *F28F 9/12* (2013.01);
(Continued)

(58) Field of Classification Search
USPC ......... 60/274, 275, 298, 300, 320, 321, 324; 165/51, 52
See application file for complete search history.

(56) References Cited

U.S. PATENT DOCUMENTS 7,178,332 B2 * 2/2007 Sasaki ................... F01N 3/2013
  136/205
8,656,710 B2 * 2/2014 Bell ........................ F01N 3/043
  165/51
(Continued)

FOREIGN PATENT DOCUMENTS

DE  102008023937 A1  11/2009
DE  102011016808 A1  10/2012
(Continued)

OTHER PUBLICATIONS

European Search Report dated Feb. 9, 2016 for European Application 15193504.6, 5 pages.

*Primary Examiner* — Binh Q Tran
(74) *Attorney, Agent, or Firm* — RMCK Law Group, PLC

(57) ABSTRACT

Described herein is a unit for conversion of thermal energy including: —a first heat-exchange unit defining a first flow path for a first thermovector fluid; and—a second heat-exchange unit defining a second flow path for a second thermovector fluid. The second flow path is obtained by a plurality of cartridge elements each including at least one element made of thermoelectric material. The second heat-exchange unit includes a first manifold element and a second manifold element, each including a connection interface to said plurality of cartridge elements, which is configured for providing a hydraulic connection with inlet orifices and outlet orifices of the cartridge elements, and an electrical connection to first electrodes and second electrodes of said plurality of cartridge elements electrically connected to the elements made of thermoelectric material.

14 Claims, 11 Drawing Sheets

(51) Int. Cl.
  *F28F 9/00* (2006.01)
  *F28F 13/06* (2006.01)
  *F28F 9/12* (2006.01)
  *F28F 9/02* (2006.01)
  *H01L 35/32* (2006.01)
(52) U.S. Cl.
  CPC ............. *F28F 13/06* (2013.01); *H01L 35/32* (2013.01); *F28F 2250/102* (2013.01)

(56) References Cited

U.S. PATENT DOCUMENTS

| | | | |
|---|---|---|---|
| 9,293,680 B2 * | 3/2016 | Poliquin | H01L 35/30 |
| 9,698,332 B2 * | 7/2017 | De Pelsemaeker | H01L 35/30 |
| 2011/0120106 A1 | 5/2011 | Hodgson et al. | |
| 2013/0186448 A1 | 7/2013 | Ranalli et al. | |
| 2014/0033703 A1 | 2/2014 | Limbeck et al. | |
| 2014/0182649 A1 | 7/2014 | Seon et al. | |
| 2014/0251579 A1 * | 9/2014 | Sloss | F01N 5/02 |
| | | | 165/96 |
| 2015/0136193 A1 * | 5/2015 | De Pelsemaeker | H01L 35/30 |
| | | | 136/205 |

FOREIGN PATENT DOCUMENTS

| | | |
|---|---|---|
| DE | 102013208447 A1 | 7/2014 |
| EP | 2381083 A1 | 10/2011 |
| EP | 2561207 A | 10/2011 |
| EP | 2874191 A2 | 5/2015 |
| EP | 2955350 A1 | 12/2015 |
| WO | 2011011795 A2 | 1/2011 |

\* cited by examiner

UNIT FOR CONVERSION OF THERMAL ENERGY

FIELD OF THE INVENTION

The present invention relates to a unit for conversion of thermal energy configured for energy exploitation of a thermovector fluid coming from an external supply source, for example the exhaust gases of a vehicle equipped with internal-combustion engine.

DESCRIPTION OF THE PRIOR ART AND GENERAL TECHNICAL PROBLEM

Thermal-energy conversion units designed for use as heat exchangers for recovery of the energy of the exhaust gases of a motor vehicle are known from a number of prior documents. The present applicant has proposed a solution of this type in European patent application published as EP 2 561 207 A1.

The solution in point is characterized by the use mainly of a plate heat exchanger within which the exhaust gases of the motor vehicle flow, which is capable in certain circumstances to limit the performance of the system, as well as the flexibility thereof.

A further solution of heat exchangers used on the exhaust line of a motor vehicle is known from document No. US 2013/0186448 A1. This heat exchanger envisages a first heat-exchange unit and a second heat-exchange unit, each defining a flow path for a respective thermovector fluid. In particular, the first heat-exchange unit provides a flow path for hot exhaust gases coming from the internal-combustion engine, whereas the second heat-exchange unit, which is located partially immersed within the environment of the first heat-exchange unit, provides a flow path for a second thermovector fluid, which exchanges heat with the flow of exhaust gases, thus increasing in temperature.

The second heat-exchange unit includes a plurality of thermoelectric cartridge elements, which are configured for providing a flow duct for the liquid that constitutes the second thermovector fluid and house within this flow duct a plurality of modules made of thermoelectric material, which are configured for generating a voltage when they are impinged upon by a thermal flow.

The solution illustrated in this document envisages purely axial flow by the first thermovector fluid, which imposes the need to provide a bypass duct for diversion of the flow of exhaust gases outside the first heat-exchange unit within the casing of the heat exchanger itself or else via a line that runs parallel to the heat exchanger itself.

The first solution is evidently undesirable in that the bypass duct for the exhaust gases is very close to the second heat-exchange unit and may consequently generate heating of the second thermovector fluid even when this is not desired, whereas the second solution is characterized by a substantial doubling of the transverse dimensions, as well as by a considerable complication in the construction of the ensemble of pipes and ducts for circulation of the second thermovector fluid.

OBJECT OF THE INVENTION

The object of the present invention is to overcome the technical problems described previously.

In particular, the object of the present invention is to provide a thermal-energy conversion unit that features at the same time high energy performance and limited overall dimensions, and that enables a rational organization of the hydraulic-electrical circuitry.

SUMMARY OF THE INVENTION

The object of the present invention is achieved by a thermal-energy converter having the characteristics that form the subject of one or more of the ensuing claims, which form an integral part of the technical teaching provided herein in relation to the invention.

In particular, the object of the invention is achieved by a thermal-energy conversion unit including:
a first heat-exchange unit defining a first flow path for a first thermovector fluid; and
a second heat-exchange unit defining a second flow path for a second thermovector fluid;
wherein:
said first heat-exchange unit includes a first inlet port for said first thermovector fluid, and a first outlet port for said first thermovector fluid, said first inlet port and first outlet port being located on a same side of said first heat-exchange unit and having a baffle therebetween so as to give a substantially "U"-shaped geometry to said first flow path;
said second heat-exchange unit includes a second inlet port and a second outlet port for said second thermovector fluid, and further includes a plurality of cartridge elements, said second flow path developing from said second inlet port, through said cartridge elements, to said second outlet port, said cartridge elements being at least partially immersed in the first flow path;
said plurality of cartridge elements are in fluid communication with a first manifold element and a second manifold element, which bear, respectively, said second inlet port and said second outlet port;
each cartridge element includes an inlet orifice and an outlet orifice for said second thermovector fluid, a heat-exchange area for exchange of thermal energy between said second thermovector fluid and said first thermovector fluid, a first electrode and a second electrode connected to at least one element made of thermoelectric material of the cartridge element; and
wherein moreover said first manifold element and said second manifold element each include a connection interface to said plurality of cartridge elements, which is configured for providing a hydraulic connection, respectively, with the inlet orifices and the outlet orifices of the cartridge elements, and an electrical connection, respectively, to the first electrodes and the second electrodes of the cartridge elements.

BRIEF DESCRIPTION OF THE DRAWINGS

The invention will now be described with reference to the annexed drawings, which are provided purely by way of non-limiting example and in which.

DETAILED DESCRIPTION OF PREFERRED EMBODIMENTS OF THE INVENTION

Figure 1:
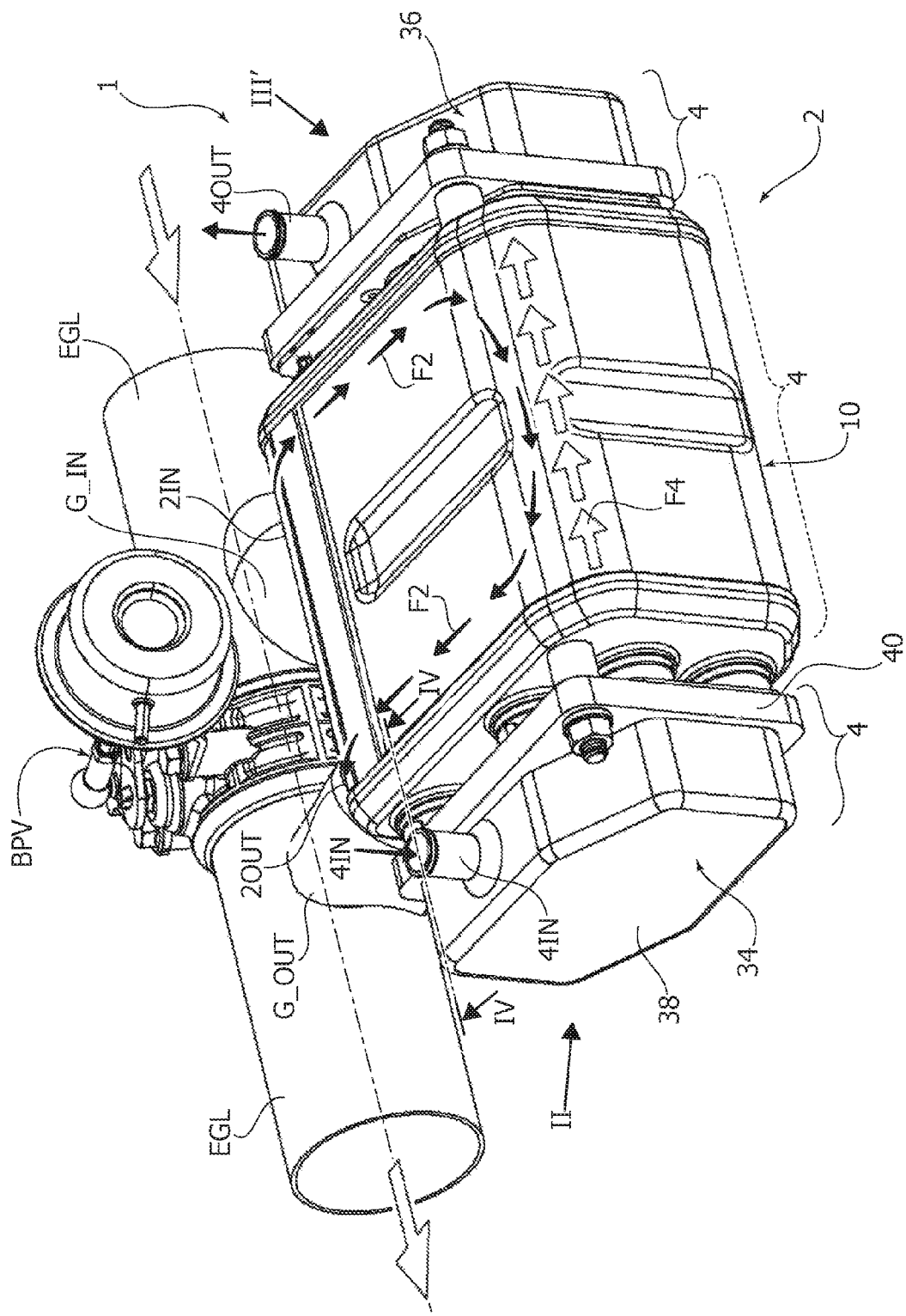
FIG. 1 is a perspective view of a thermal-energy conversion unit according to a preferred embodiment of the invention.
Figure 2:
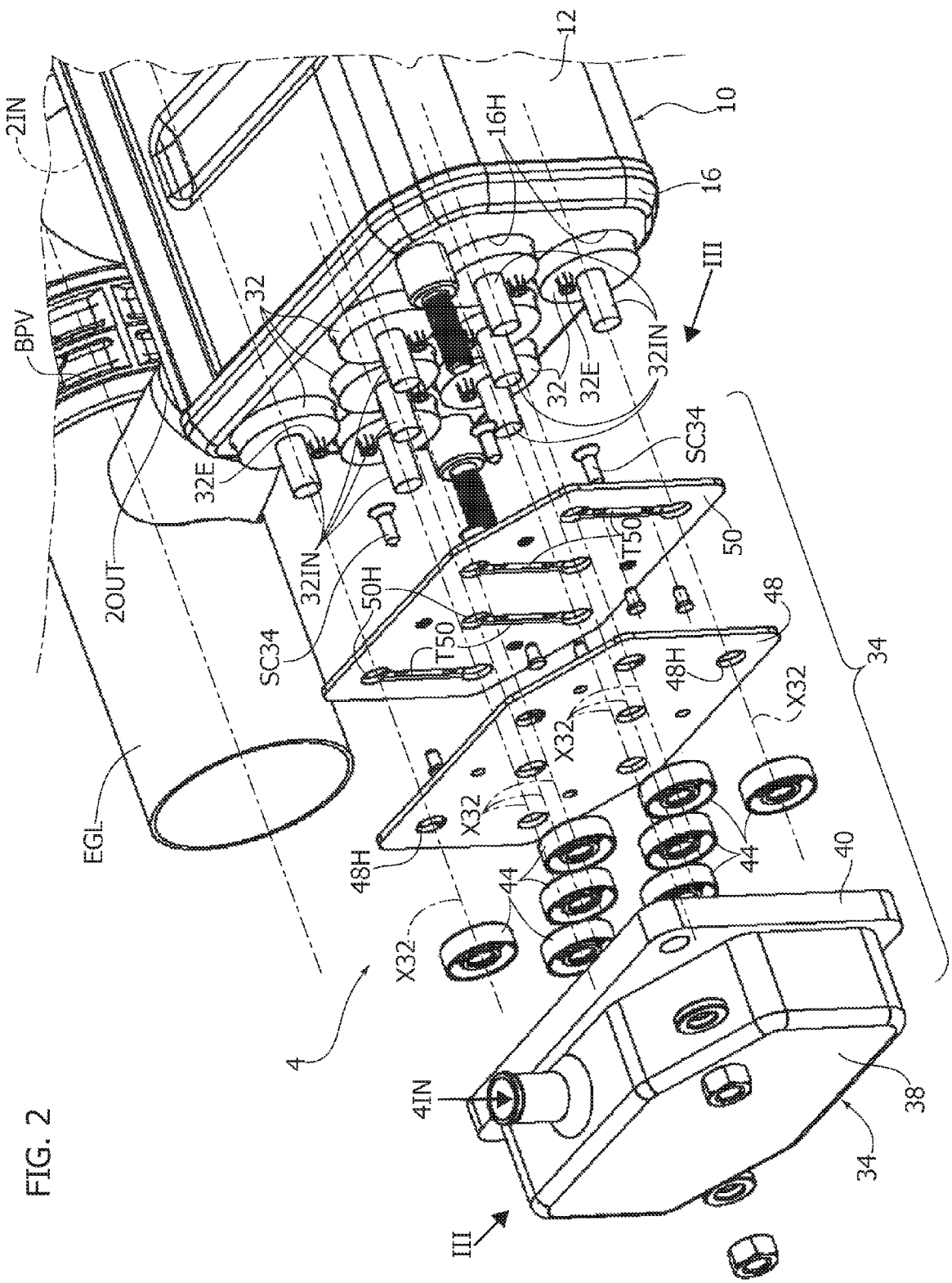
FIG. 2 is an exploded perspective view of a portion of the thermal-energy conversion unit indicated by the arrow II of FIG. 1.
Figure 3:
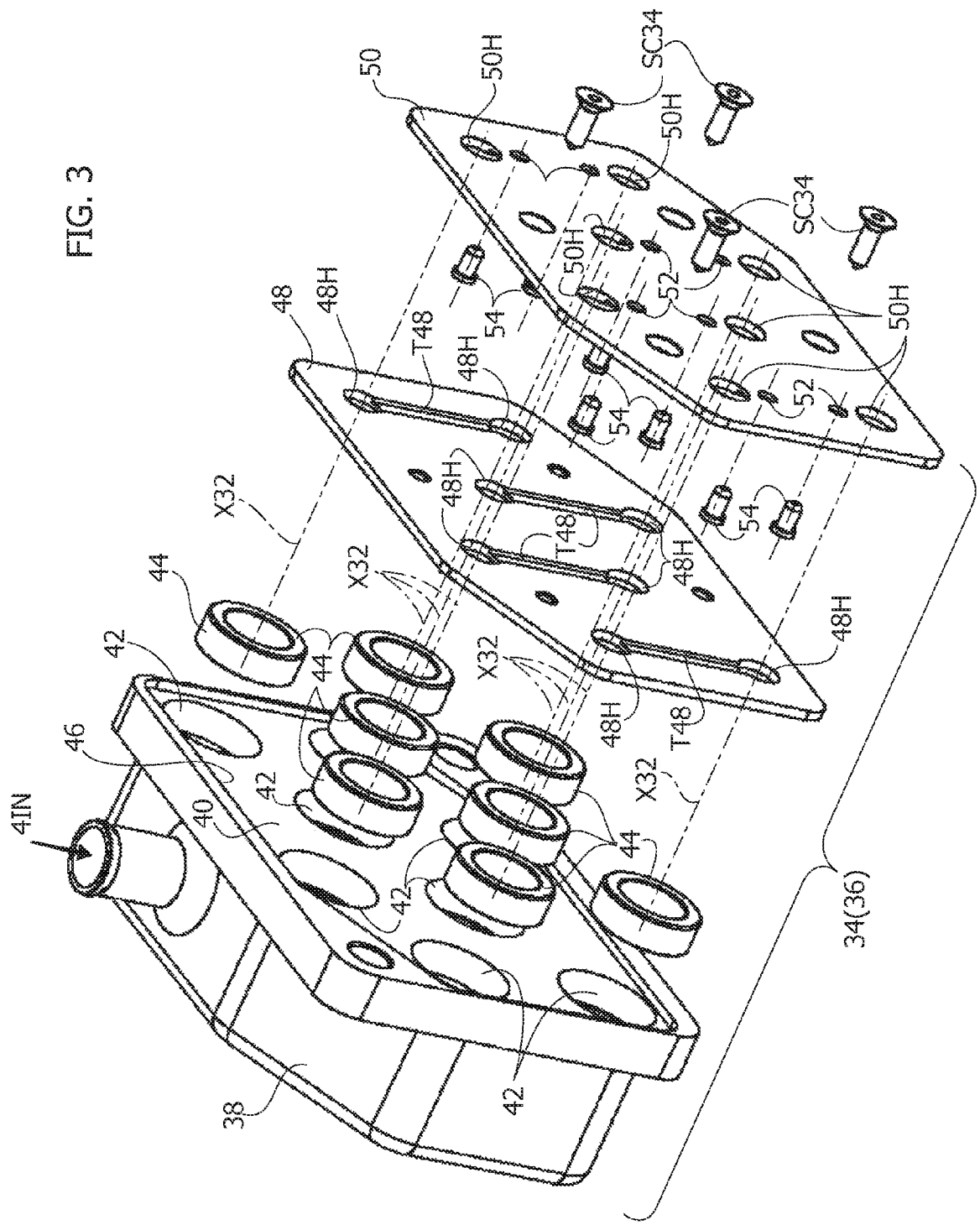
FIG. 3 is an exploded perspective view of an assembly indicated by the arrow III in FIG. 2.
Figure 3A:
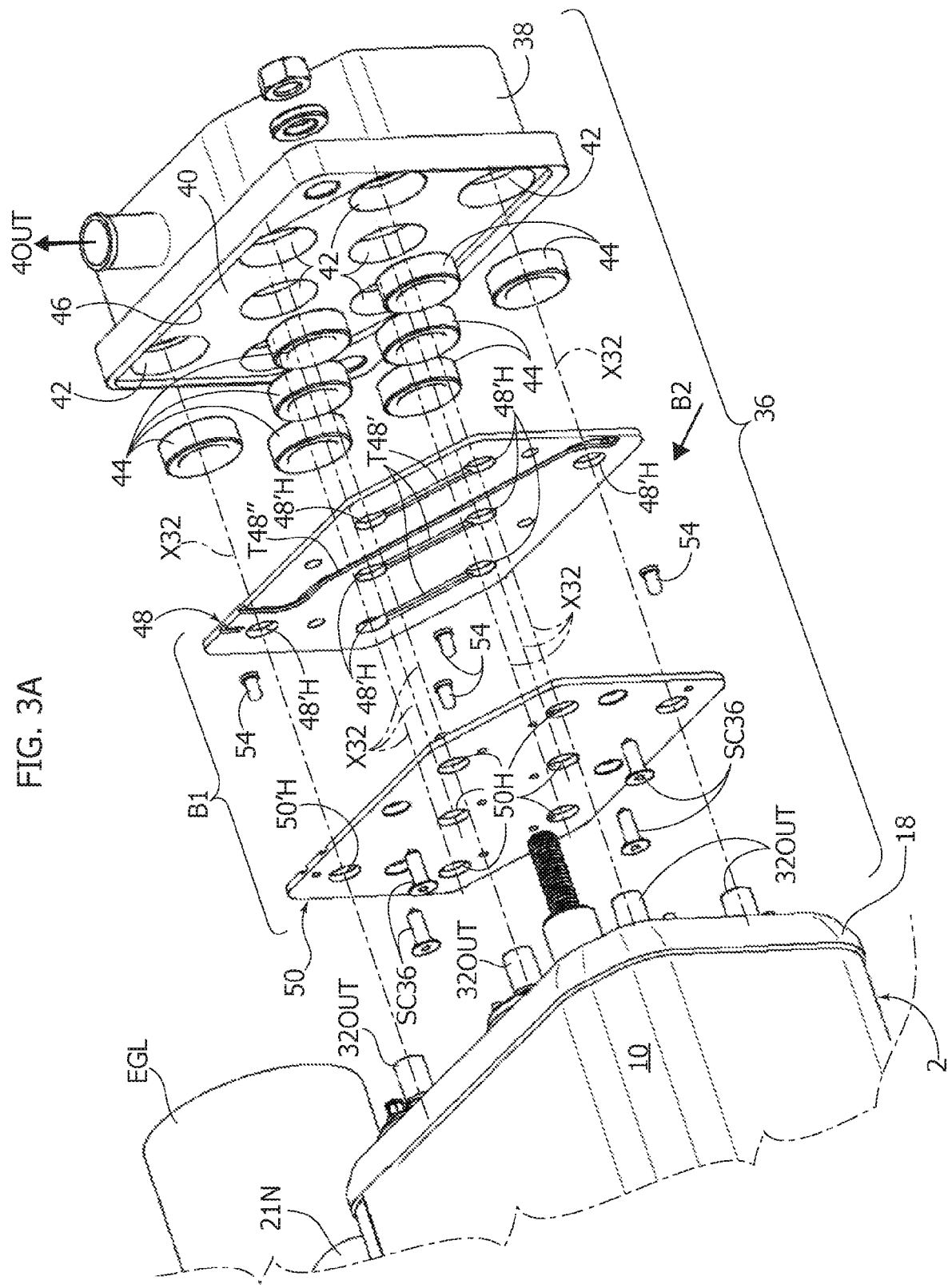
FIG. 3A is an exploded view of an assembly indicated by the arrow III' in FIG. 1.
Figure 3B:
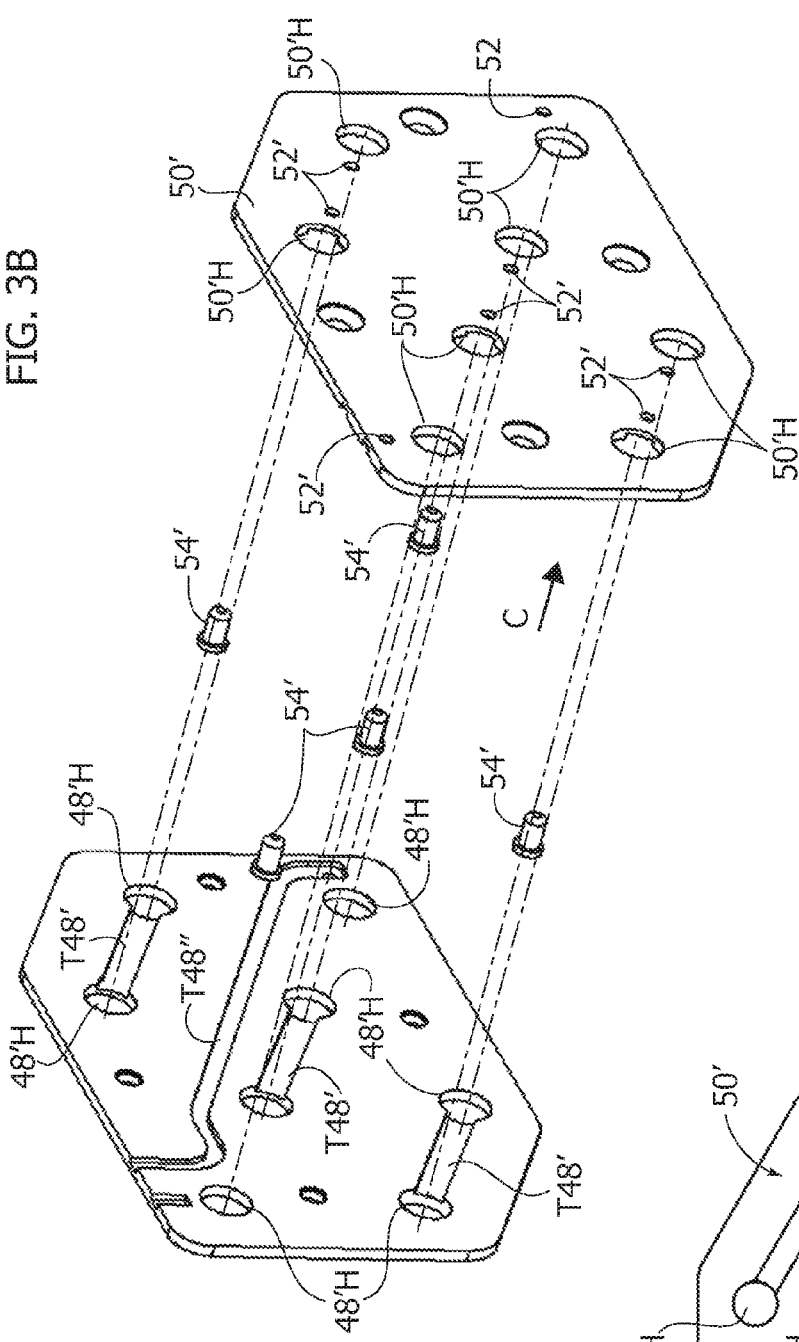
FIG. 3B is an exploded perspective view of a set of components identified by the reference B1 in FIG. 3A and indicated by the arrow B2 in the same figure.
Figure 3C:
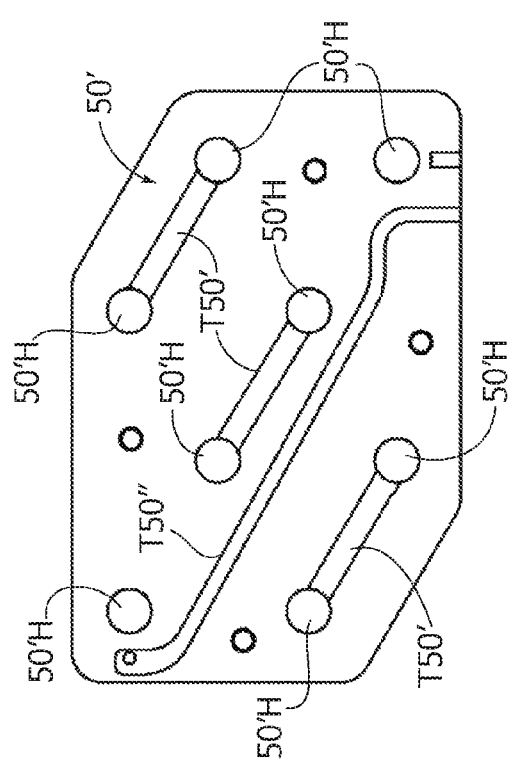
FIG. 3C is an orthogonal view according to the arrow C of FIG. 3B.

The reference number 1 in FIG. 1 designates as a whole a thermal-energy conversion unit according to a preferred embodiment of the invention. The conversion unit 1 includes a first heat-exchange unit 2 defining a first flow path F2 for a first thermovector fluid, and a second heat-exchange unit 4 defining a second flow path F4 for a second thermovector fluid. The first flow path F2 develops between a first inlet port 2IN and a first outlet port 2OUT, whereas the second flow path develops between a second inlet port 4IN and a second outlet port 4OUT.

The first inlet port 2IN and the first outlet port 2OUT are set on a same side of the first heat-exchange unit 2 and have a baffle 2W set therebetween in such a way that the first flow path F2 is provided with a substantially "U"-shaped geometry, as may be seen in the schematic representation of the path F2 in FIG. 1.

Figure 5:
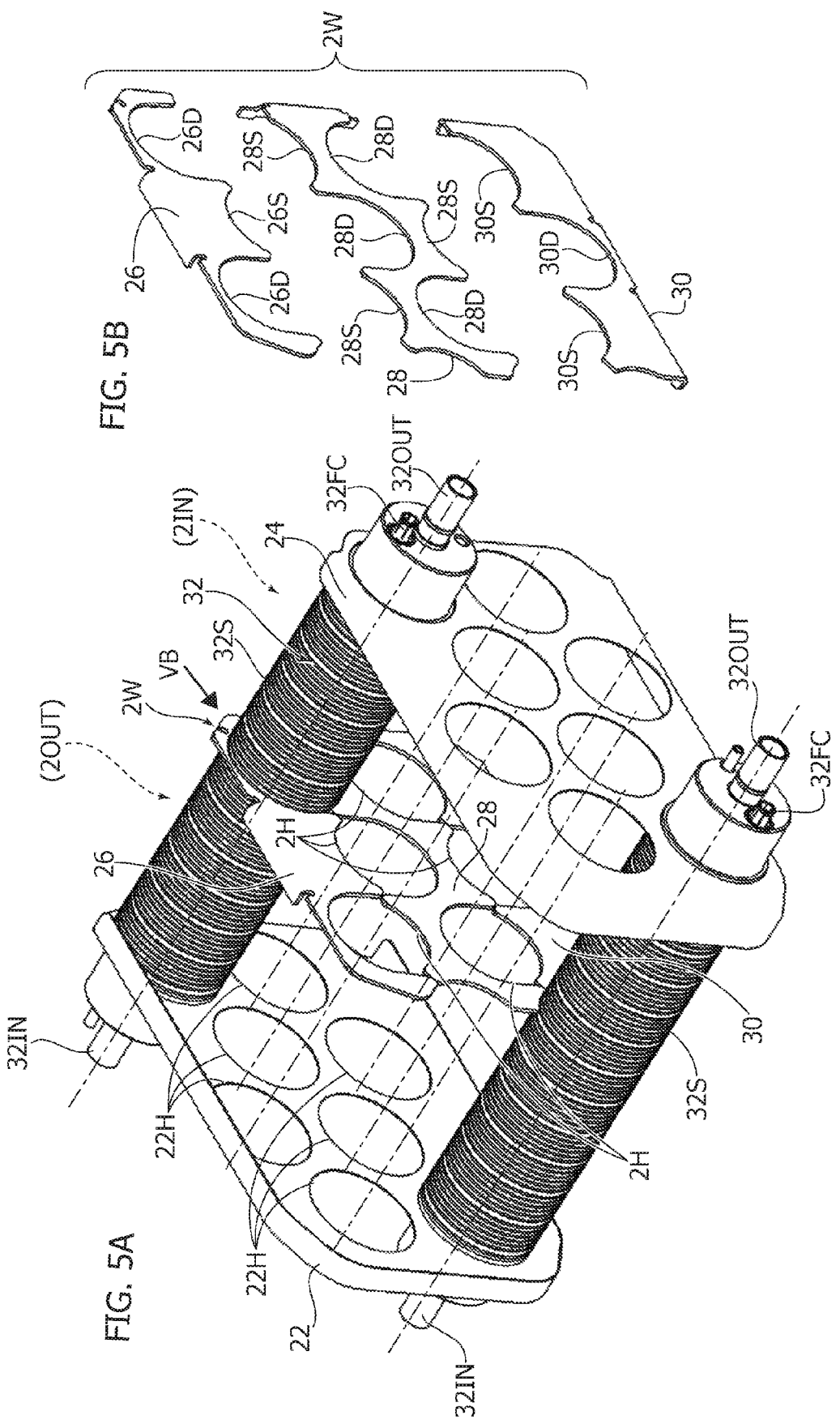
FIG. 5A is a perspective view, with some components removed for reasons of clarity, of components inside the conversion unit of FIG. 1, whilst
FIG. 5B is an exploded perspective view of a set of components identified by the arrow VB of FIG. 5A.
Figure 6:
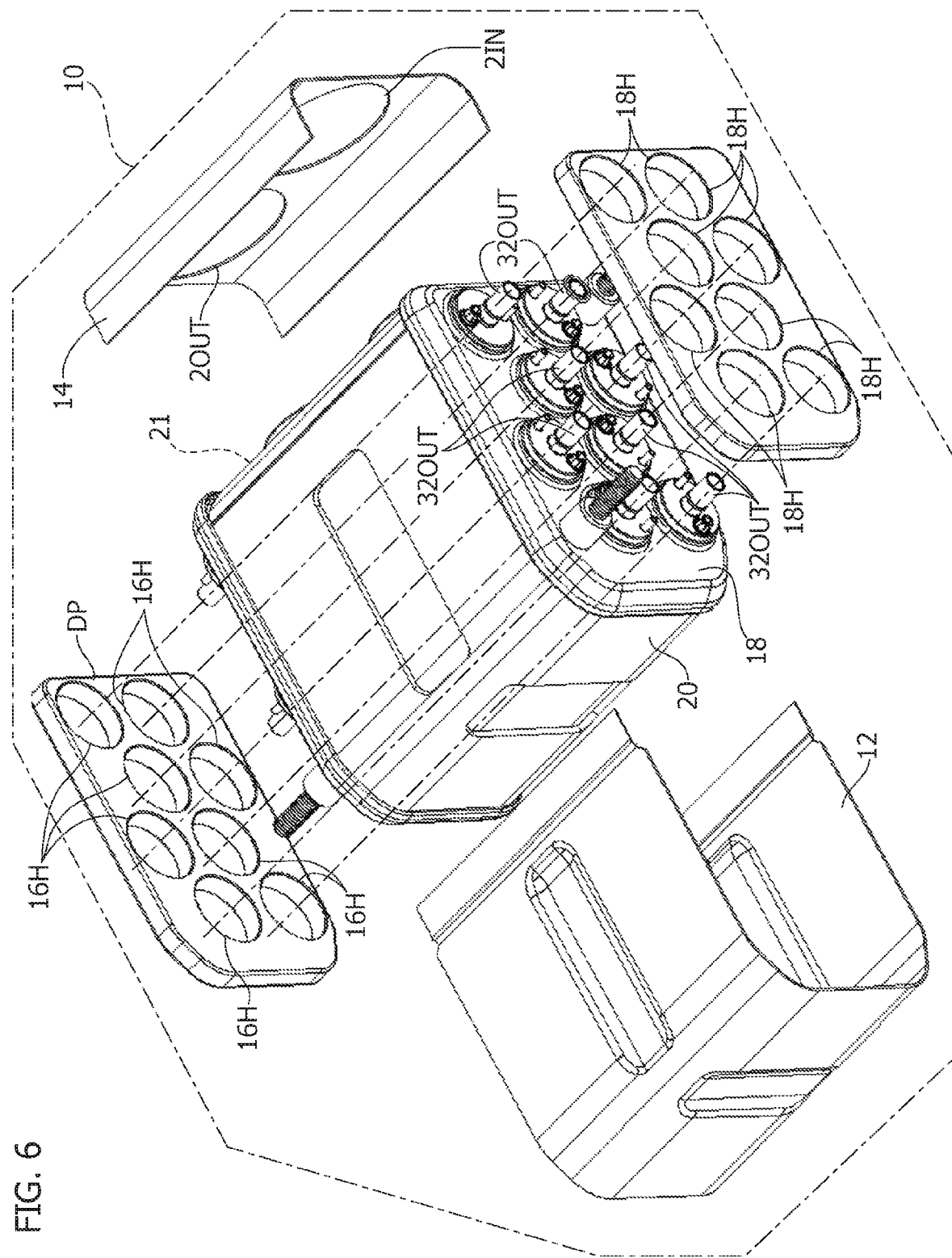
FIG. 6 is a partially exploded perspective view of a first heat-exchange unit of the conversion unit of FIG. 1.

With reference to FIGS. 1, 5A, 5B and 6, the first heat-exchange unit 2 includes a casing 10 preferably obtained by assembly of shaped metal sheets. With reference to FIGS. 5A, 5B and 6, the casing 10 has a substantially octagonal prismatic shape (or else a rectangular prismatic with chamfered edges) and includes a set of skin metal sheets and a set of frame metal sheets. The set of skin metal sheets comprises a first skin metal sheet 12, which is substantially U-shaped, a second skin metal sheet 14, which is substantially C-shaped, and a first end metal sheet 16 and a second end metal sheet 18.

The first skin metal sheet 12 defines roughly three quarters of the outer lateral surface of the heat-exchange unit 2, with the remaining lateral surface defined by the metal sheet 14. The latter is configured for being joined to the metal sheet 12 so as to complete the lateral surface of the unit 1 and moreover bears two openings set alongside one another corresponding to the ports 2IN and 2OUT.

The end metal sheets 16, 18 are substantially tray-shaped with a rim that fits on the metal sheets 12 and for coupling therewith. The metal sheets 16, 18 are moreover provided with a set of eight holes each, wherein each hole is identified by the reference 16H for the metal sheet 16, and 18H for the metal sheet 18. The holes 16H, 18H have the same shape, size, and arrangement so as to be each coaxial to a homologous hole on the other plate when the metal sheets 16, 18 are assembled to the metal sheets 12, 14. In the embodiment considered herein, the holes 16, 18 have a quincuncial arrangement. Preferentially, in the embodiment illustrated herein, set between the metal sheets 16 and 22, 18 and 24 is a perforated spacer plate DP that bears a repetition of the holes 16H and 18H (equivalently 22H and 24H), once again in positions that are coaxial therewith.

The set of frame metal sheets is visible in both FIGS. 5A and 5B and FIG. 6 and comprises a first frame metal sheet 20, a second frame metal sheet 21, which are shaped in a way similar to the skin metal sheets 12, 14 (the metal sheet 21 also bears two holes corresponding to the ports 2IN and 2OUT) and are configured to fit on a sequence of metal sheets including a third end frame metal sheet 22 and a fourth end frame metal sheet 24, and the baffle 2W that is set between the metal sheets 22, 24 in a position contiguous to the metal sheets 14, 21.

Each metal sheet 22, 24 has a shape substantially similar to that of the corresponding end skin metal sheets 16, 18 and is also provided with a plurality of holes 22H, 24H having the same arrangement, shape, and size as the corresponding holes 16H, 18H, so that on opposite sides of the casing 10 there exist pairs of holes 16H, 22H and 18H, 24H that are coaxial when the metal sheets of the first unit 2 are assembled.

As regards the baffle 2W, it is a perforated plate conveniently obtained in a plurality of plates set alongside, and connected to, one another.

In this embodiment, the baffle 2W is provided in three distinct portions including a first peripheral portion 26, an intermediate portion 28, and a second peripheral portion 30 joined together according to this sequence. Each of the portions 26, 28, 30 has a perimeter characterized by the alternation of shallow and deep grooves. The shallow grooves are designated by the same references as the corresponding metal sheets (26, 28, 30) followed by the letter S, whereas the deep grooves are designated by the same references as the corresponding metal sheets (26, 28, 30) followed by the letter D.

The alternation of shallow and deep grooves on the metal sheets 26, 28, 30 is obtained in such a way that, when they are joined together, each shallow groove is joined to a deep groove so as to identify an array of holes 2H with quincuncial arrangement, wherein each hole 2H is constituted by the union a deep groove and a shallow groove. The holes 2H are in a number smaller than the holes 16H, 18H, 22H, 24H, but have a substantially identical shape and arrangement so as to be coaxial therewith (in the case where the holes correspond). In fact, the baffle 2W does not extend throughout the width of the casing 10, but starts from the metal sheet 21 between the ports 2IN and 2OUT and terminates before the opposite side in such a way as to define a U shape with a first branch that starts from the port 2IN and is delimited laterally by the metal sheet 22 and by the baffle 2W, a second branch that proceeds towards the port 2OUT and is delimited laterally by the metal sheet 24 and by the baffle 2W, and a stretch astride of the two branches defined between the free edge of the baffle 2W and the metal sheet 20.

With reference to FIG. 1, FIGS. 2 to 4, and also FIGS. 5A, 5B and 6, the second heat-exchange unit 4 includes the second inlet port 4IN for a second thermovector fluid, the second outlet port 4OUT for the second thermovector fluid, and a plurality of cartridge elements 32 that are in fluid communication with the second inlet port and the second outlet port 4IN, 4OUT to provide the second flow path F4, and that are installed at least partially immersed within the casing of the unit 2 owing to their axial insertion in a sequence of holes 16H, 22H, 2H (except for the cartridge elements 32 that are located in the stretch of the path F2 astride of the two branches of the "U"-shaped geometry), 24H, 18H.

It should be noted in any case that in alternative embodiments it is possible to do without the structure with skin and frame metal sheets in favour of a structure with a single layer of metal sheets. Whatever the solution chosen, in any case the casing 10 will appear externally as including:

a plurality of through holes, which are provided at opposite longitudinal ends (here metal sheets 16, 18, 22, 24) and are arranged coaxially with respect to one another so as to receive in pairs a corresponding cartridge element 32; and a wall (here metal sheets 14, 21), which bears a first opening and a second opening that form the first inlet port 2IN and first outlet port 2OUT, and wherein the baffle 2W is a perforated plate set inside the casing in a position contiguous to the wall between the first and second openings, where the holes 2H on the baffle 2W have the same position with respect to corresponding pairs of holes in the opposite longitudinal ends so as to receive the corresponding cartridge elements 32.

The cartridge elements 32 are in fluid communication with a first manifold element 34 of the heat-exchange unit 4 and a second manifold element 36 of the heat-exchange unit 4, provided on which are the second inlet port and the second outlet port 4IN, 4OUT, respectively.

Each cartridge element has a longitudinal axis X32 and includes an inlet orifice 32IN and an outlet orifice 32OUT, which project outwards from the casing 10, in particular from opposite longitudinal ends (metal sheets 16, 18) of the first heat-exchange unit 2, and from the first flow path F2.

Extending between the orifices 32IN and 32OUT is a tubular skirt 32S (illustrated herein as being fitted on two end cups, which bear the orifices 32IN and 32OUT), immersed within the unit 2, which in addition to delimiting the volume within which the second thermovector fluid moves, offers to the corresponding element 32 a heat-exchange area for exchange of thermal energy with the first thermovector fluid.

Each cartridge element 32 further includes at least one element made of thermoelectric material, which is connected to a first electrode and a second electrode preferentially arranged one on the same side as the orifice 32IN and the other on the same side as the orifice 32OUT. The electrodes are designated by 32E in the figures.

In a preferred embodiment, the cartridge elements 32 may be obtained in a way corresponding to the thermoelectric cartridge elements described in document No. US 2013/186448 A1. In this case, as emerges from an examination of the aforementioned document, each cartridge element 32 includes a plurality of annular elements bearing tabs made of thermoelectric material, where the annular elements are connected together in series with wire electrodes that give out on the outside of the cartridge element.

Advantageously, the tubular skirt 32S of the cartridge element 32 may moreover be provided with a corrugated geometry so as to increase the heat exchange area between the first and second thermovector fluids.

In alternative embodiments, the cartridge elements 32 may, instead, be provided in a different way, and may in particular be equipped with a thermoelectric element in the form of a lining made of thermoelectric material directly exposed to the flow of the second thermovector fluid.

Figure 4:
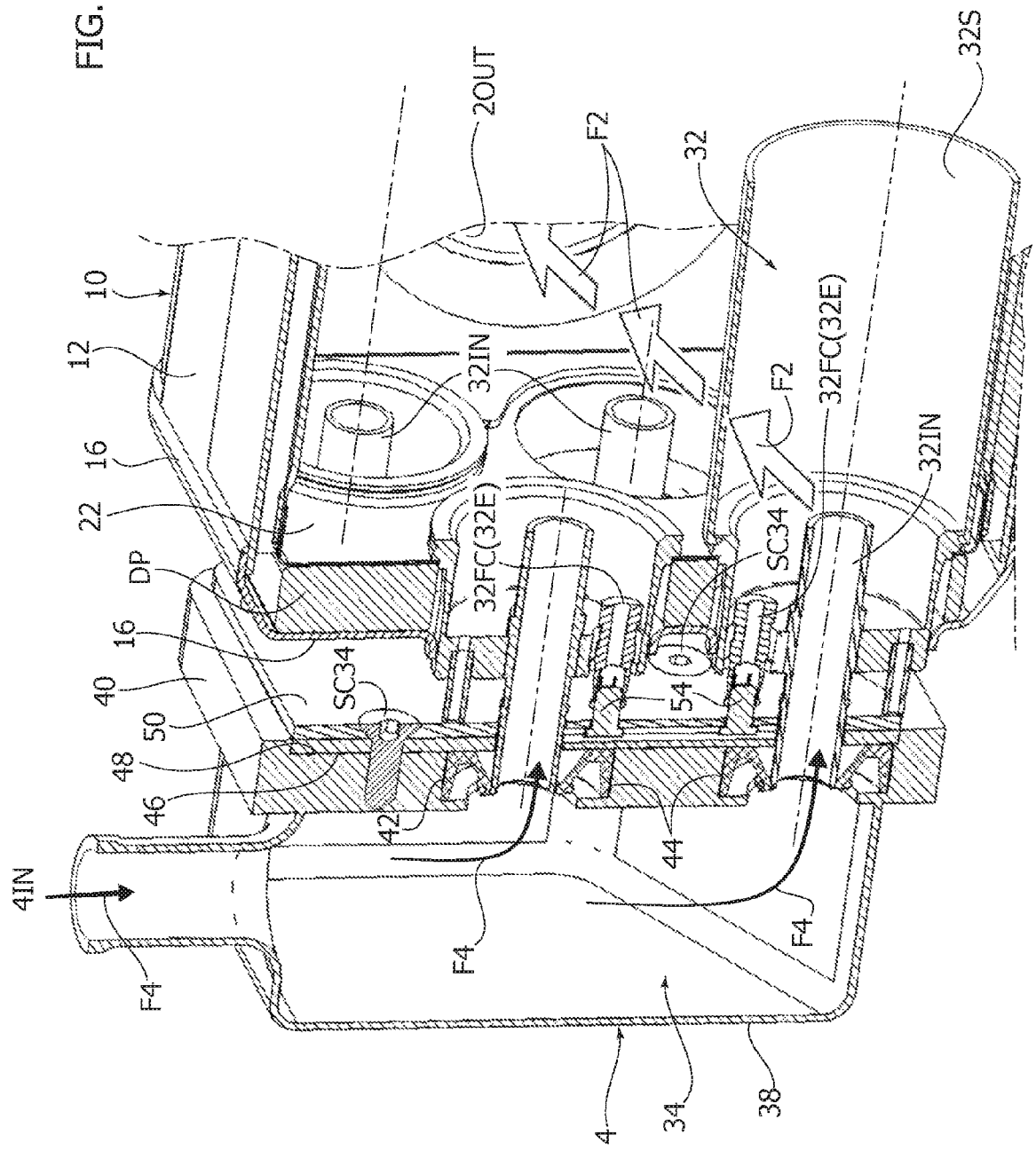
FIG. 4 is a cross-sectional view according to the trace IV-IV of FIG. 1.

Whatever the embodiment, on the basis of an advantageous aspect of the invention, the electrodes 32E are obtained as female electrical connectors 32FC, as illustrated in the cross-sectional view of FIG. 4. The female connectors 32FC may be advantageously equipped with a radially deformable end so as to receive a corresponding male connector with a substantially snap-fit system.

For this purpose, according to an advantageous aspect of the present invention, each manifold element 34, 36 includes a connection interface to the cartridge elements 32, which is configured for providing a hydraulic connection to a corresponding one of the aforesaid inlet orifice 32IN and outlet orifice 32OUT (according to the side on which the manifold element is located, 32IN for the element 34, 32OUT for the element 36). This is made possible, among other things, by the fact that the orifices 32IN and 32OUT project outwards from the casing 10, in particular from opposite longitudinal ends (metal sheets 16, 18) of the first heat-exchange unit 2, and from the first flow path F2.

The connection interface is likewise configured for providing an electrical connection to the electrodes 32E or 32FC electrically connected to the at least one element made of thermoelectric material.

With reference to FIG. 2, FIG. 3, and FIGS. 3A-3C, the structure primarily of the manifold element 34 will now be described, it being understood that this description applies identically to the manifold 36, except for minor modifications to the geometry that are due to the installation thereof at the opposite end of the unit 2. The reference numbers adopted are in general identical for the two manifolds and designate the same components. In the case where the components are different from the structural and/or functional standpoint, they are designated by distinct references.

The manifold element 34 includes a tray-shaped head delimited on one side by a flange 40 preferably provided integral with the head 38 (which also bears integrally the port 4IN, 4OUT for the manifold 36). The flange 40 includes a perforated diaphragm wherein through holes 42 are made in a number and with an arrangement similar to the holes 16H, 22H (for the manifold 34) and 18H, 24H (for the manifold 36).

Each hole 42 is configured for housing an annular gasket 44, which is preferably made of elastomeric material and is equipped with a metal elastic ring to ensure tightness of the gasket on a tubular element, in this case the inlet and outlet orifices 32IN and 32OUT.

The holes 42 are provided in a surface that is located on the bottom of a recess 46, the depth of which is chosen in such a way as to house at least one of a first plate 48 and a second plate 50 (48', 50' for the manifold 36) packed together. In the embodiment considered, only the plates 48, 48' are housed within the recess 46, whereas the plates 50, 50' project outwards. In any case, fixing of the pack of plates 48, and 48', 50' is provided, for example, by means of screws SC34, SC36 that engage in the packs of plates and on the perforated diaphragms of the flanges 40.

Each plate 48, 50 and 48', 50' is moreover provided with through holes 48H, 50H and 48'H, 50'H in the same number and having the same shape and arrangement as the holes 42; i.e., also these are holes arranged quincuncially and coaxial to the axes X32 of the cartridge elements 32.

On each of the plates 48, 50 and 48', 50' there are moreover provided one or more recessed tracks that—when coupled together—provide channels for passage of electrical connectors.

In greater detail, the plates 48, 50 include recessed tracks T48, T50, which extend bridge-wise between pairs of holes

48H, 50H. In particular, the plates 48, 50 include four identical recessed tracks T48, T50, which extend between pairs of holes 48H, 50H with axes aligned with respect to one another in a plane parallel to the axes X32 and to the plane of the ports 2IN, 2OUT.

The plates 48' and 50' include, instead, three recessed tracks T48', T50', which extend bridge-wise between three distinct pairs of holes 48'H, 50'H arranged along diagonal sequences of holes 48'H, 50'H. Each plate 48', 50' includes a substantially S-shaped track T48", T50", which extends from a first end hole to a second end hole of the longer diagonal of holes on the two plates 48', 50'.

Furthermore, all the tracks T50 and T50' are traversed by through holes 52, 52', inserted in which are male electrical connectors 54, 54' with mushroom heads, which abut on the bottom of the tracks T50, T50', thus stably positioning the electrodes 54. The electrodes 54 are moreover electrically connected by means of electrical conductive elements housed within channels constituted by front coupling of homologous tracks T48, T50 and T48', T50' and of the tracks T48", T50", thus guaranteeing an excellent shielding of the electrical circuitry in regard to any infiltration of various liquids and/or contaminants.

With reference to FIG. 4, when the manifold elements 34, 36 are fixed to opposite longitudinal ends of the unit 2 (in particular, of the casing 10), the plates 48, 50 and 48', 50' are fixed to the heads 38 presenting the electrodes 54 oriented towards the ends of the unit 2, and the gaskets 44 are blocked between the plates 48, 48' and the flanges 40 so that there is globally created a connection interface in which:

the gaskets 44 receive within them the inlet orifices 32IN (manifold 34) and outlet orifices 32OUT (manifold 36) ensuring tightness in regard to any leakage of the second thermovector fluid; and the male electrodes 54 penetrate into the female electrodes 32FC when the manifolds 34, 36 are coupled to the unit 2, thus providing electrical connection, according to a pre-set scheme, of the elements made of thermoelectric material housed within the cartridge elements 32; here, in particular, it is a series electrical connection scheme.

This explains how each manifold element 34, 36 includes a connection interface to the plurality of cartridge elements 32, which is configured for providing a hydraulic connection to a corresponding one of the orifices 32IN, 32OUT, and is likewise capable of providing an electrical connection to corresponding first and second electrodes 32FC, which are located at the opposite ends of each cartridge element 32 and accordingly constitute a positive or negative electrode.

It should be noted in this connection that the female electrical connectors 32FC must be made of materials with high electrical conductivity in so far as the elements made of thermoelectric material that may typically be used in cartridge elements such as the elements 32 possess an intrinsic resistance that is of at least one order of magnitude less than the intrinsic electrical resistance of any commercially available standard connector. For instance, it is possible to make the connectors 32FC of copper or some other material having comparable electrical conductivity. Shown schematically in FIGS. 7 and 8 is the diagram of electrical connection between the elements 32 that is obtained when the manifolds 34, 36 are joined to the unit 2.

In particular, the schematic representation shows the metal sheets 16 (FIG. 7) and 18 (FIG. 8), i.e., with views from the side of the manifold 34 and from the side of the manifold 36, respectively.

The electrical connections here represented schematically with solid arrows obviously have the same arrangement as the tracks T48, T50, T48', T50' (except for the connection that starts from the terminal A, which functionally corresponds to the tracks T48", T50") on the plates 48, 50 and 48', 50', located within which are the electrical conductors. Furthermore, it will be appreciated how the electrical interface with the outside is obtained at the manifold 36 (terminals A, B). Alongside or at each terminal/electrode a circle appears associated with the sign + or − to indicate that it is a positive (+) terminal/electrode or a negative (−) terminal/electrode.

Figure 7:
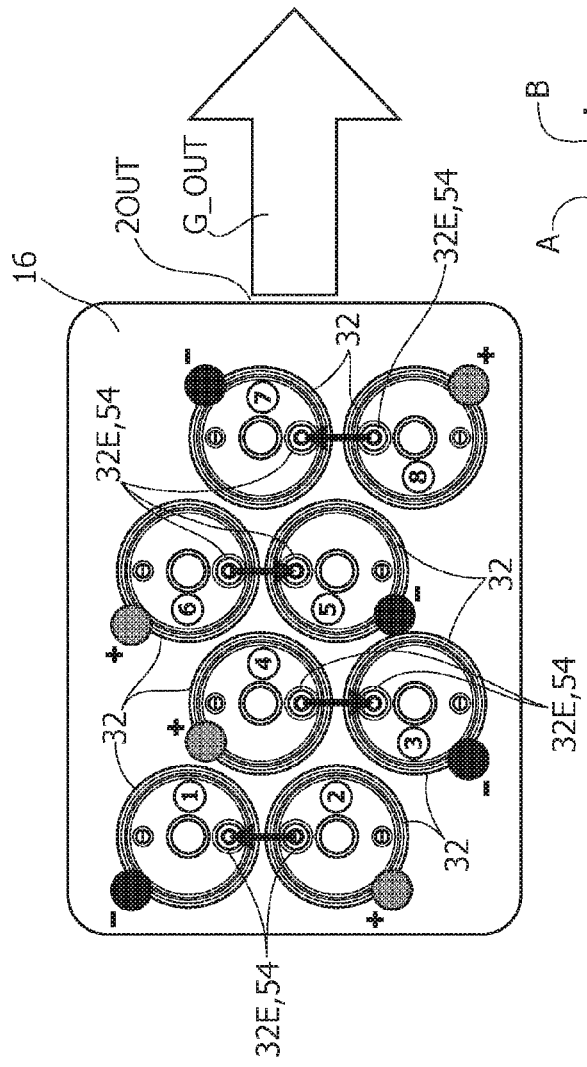
FIGS. 7 and 8 are front schematic views of electrical connections within the conversion unit according to the invention.
Figure 8:
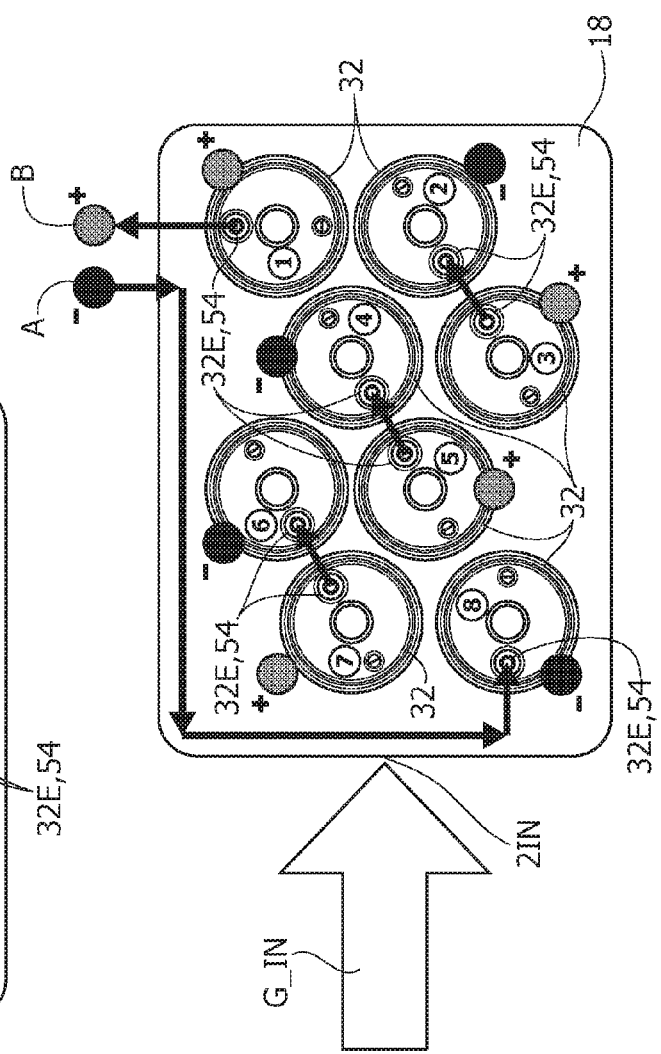

To facilitate understanding of the connections between thermoelectric elements within the elements 32, in FIGS. 7 and 8 they are associated to the encircled reference numbers 1 to 8. The connection sequence starts from element 8 (terminal A, FIG. 8) and terminates with element 1 (terminal B, once again in FIG. 8), where passage from one element to the next occurs after prior axial traversal of the element itself (from FIG. 8 to FIG. 7 and back). The person skilled in the art will have no difficulty in understanding that it is—as has been anticipated—an electrical series connection.

Operation of the conversion unit 1 is described in what follows.

Figure 9:
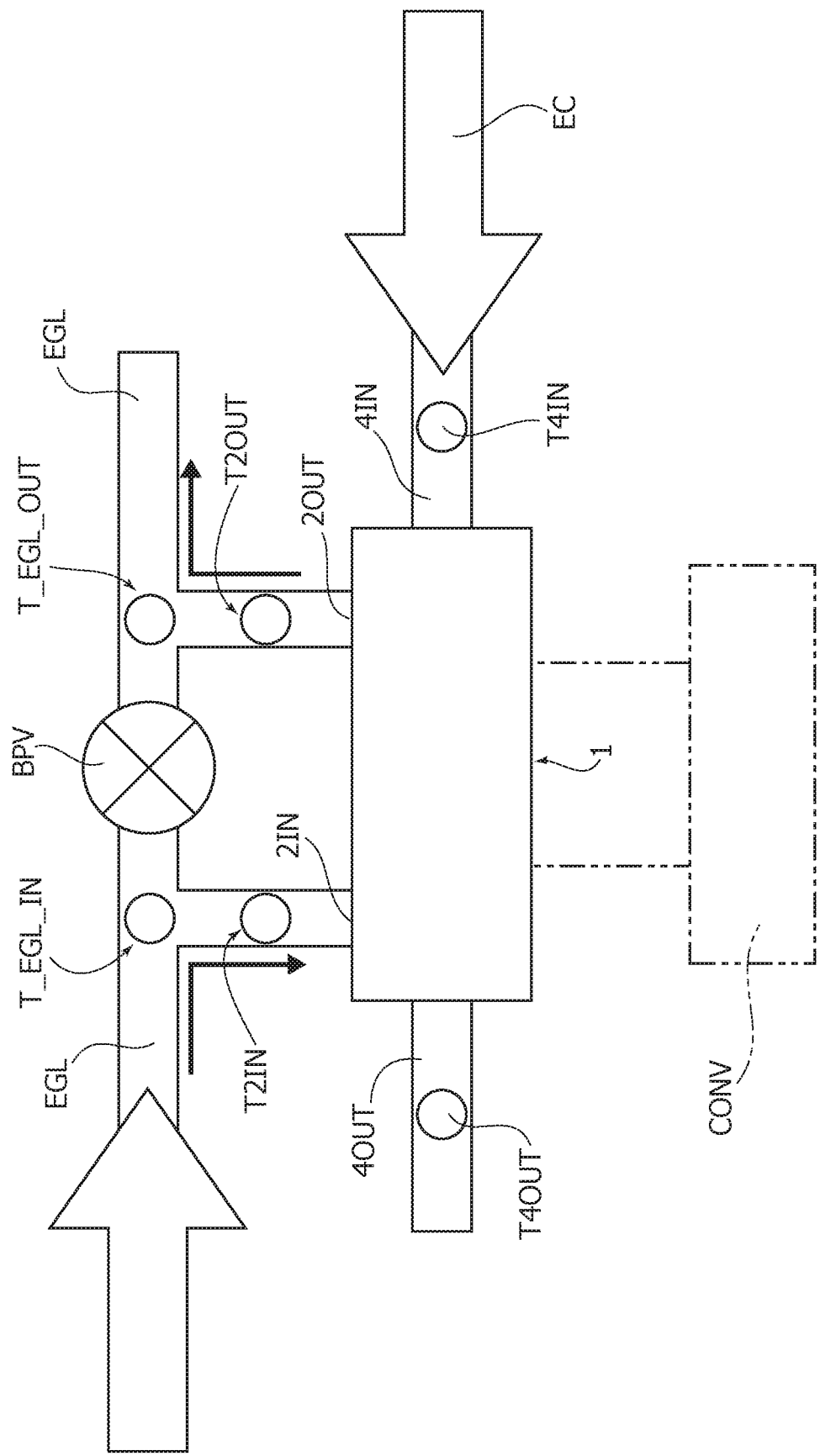
FIGS. 9 and 10 are schematic circuit representations of a preferred mode of use of the conversion unit according to the invention.
Figure 10:
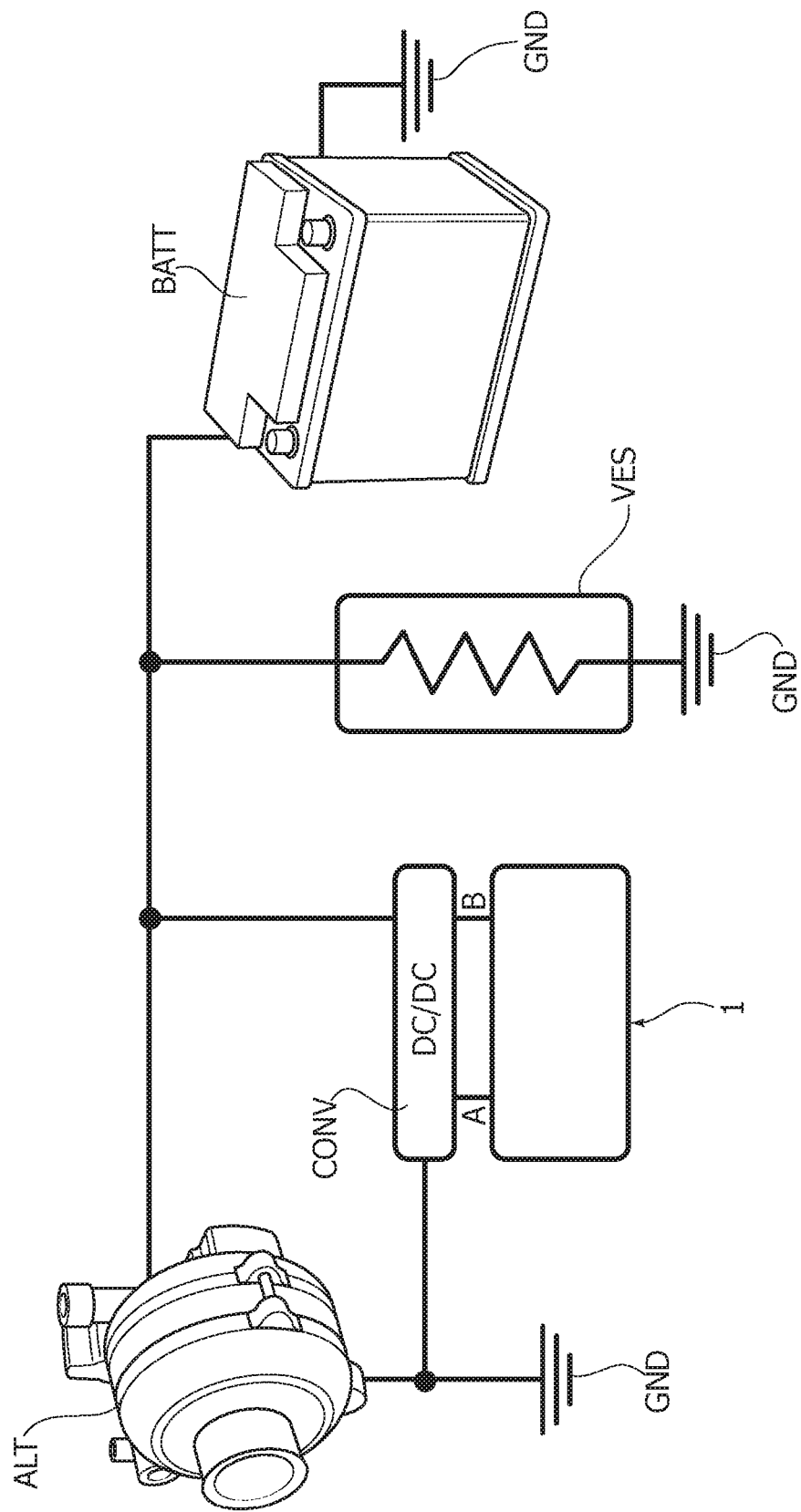

With the sole purpose of describing as clearly as possible operation of the unit 1, reference is made to the preferred application schematically illustrated in FIGS. 9, 10, where the conversion unit 1 is installed branching off an exhaust-gas line EGL of a motor vehicle, installed on which is a bypass valve BPV astride of an inlet branch G_IN connected to the port 2IN and an outlet branch G_OUT connected to the port 2OUT.

The valve BPV is configured for regulating the flow rate of the exhaust gases in the line EGL that traverses the first flow path F2, thereby constituting the first thermovector fluid. The second heat-exchange unit 4 is supplied with a second thermovector fluid constituted by a coolant of the internal-combustion engine.

Furthermore, the conversion unit 1 is electrically connected to a DC/DC converter designated by the reference CONV which is electrically connected between a low-voltage branch (approx. 15 V) and a ground branch GND in parallel with an alternator ALT of the vehicle, a battery BATT, and a vehicle electrical system VES, so as to assist the alternator ALT in recharging the battery BATT and/or supplying electrical energy to the system VES.

When the internal-combustion engine of the vehicle is running, the exhaust gases are sent on into the exhaust line EGL, typically after traversing an after-treatment unit that varies according to the type of engine and of vehicle. The flow of the exhaust gases reaches the branch G_IN and the valve BPV. According to the position of the valve BPV, preferentially an electrically actuated throttle valve of a type per se known, from 0% to 100% of the flow rate of the exhaust gases in the line EGL is sent on to the branch G_IN towards the port 2IN.

The hot exhaust gases enter the unit 2 through the port 2IN and invade the internal space of the casing 10, impinging upon the ensemble of elements 32 in the portion comprised between the metal sheet 22 and the baffle 2W (first stretch of the U shape of the path F2). Then the flow of exhaust gases traverses the stretch astride of the first and second stretches of the U shape and impinges once again (but in an opposite direction) upon the cartridge elements 32 in the portion comprised between the baffle 2W and the metal sheet 24.

The person skilled in the branch will hence appreciate that, unlike the solution known from US 2013/0186448 A1, the elements 32 are not impinged upon in a uniform way by the flow exhaust gas, but are subjected to the action a flow of hot gas that is at a different temperature and moves in the opposite direction according to the position with respect to the baffle 2W, i.e., according to the branch of the U-shaped path it flows through. The temperature field along each element 32 is hence non-uniform across the baffle 2, with a slight exception as regards the one or more elements 32 that do not traverse the baffle 2W in so far as they are located in the area between the two stretches of the U-shaped path.

At the same time, the second flow path F4 is invaded by a flow of coolant of the internal-combustion engine of the vehicle, which enters the manifold 34 through the port 4IN, traverses the inlet orifices 32IN, and enters in parallel the ensemble of cartridge elements 32, and then and comes out through the orifices 32OUT, being collected in the manifold 36 and exiting through the port 4OUT. During traversal of the cartridge elements 32, the flow of coolant exchanges thermal energy with the flow of exhaust gases that passes within the flow path F2 impinging upon the elements 32, and its temperature increases.

At the same time, the temperature gradient of the fluid within the cartridge elements 32 leads, thanks to the presence of the thermoelectric elements within the cartridge elements 32, to conversion of a share of thermal energy exchanged into electrical potential energy owing to the thermoelectric effect, giving rise to a potential difference (voltage) that is applied to the connection in series of the elements made of thermoelectric material in the cartridge elements 32.

The electric power generated is then collected at the terminals A and B and sent on to the converter CONV for use on board the vehicle, for example as electric power auxiliary to that of the alternator ALT.

The increase in temperature of the vehicle coolant that flows in the path F4 can be used to set up in a faster way conditions of climatic comfort within the compartment passenger of the vehicle, for example in the event of cold starting.

The person skilled in the art will hence appreciate the extreme rationality and compactness of the conversion unit 1: all the hydraulic and electrical connections necessary for operation of the conversion unit itself are grouped together on a single connection interface for each manifold element 34, 36.

Furthermore, the gaskets 44, albeit maintaining fluid tightness in regard to leakage of coolant, enable axial thermal expansion of the cartridge elements 32 when these are impinged upon by the flow of hot exhaust gases that pass in the flow path F2, preventing any undesired failure of the elements 32 themselves.

In addition, all the electrical connections between the elements made of thermoelectric material of the cartridge 32, which are external to the cartridges 32 themselves, are embedded within the tracks T48, T50, T48', T50', T48" and T50" and—as has been said—are in this way shielded from any possible infiltration of liquids or contaminating agents.

Finally, the inventors have noted how the U-shape of the flow path F2 in combination with the conformation of the flow path F4 leads to the cartridge elements 32 being impinged upon by a flow of gas at a different temperature according to the axial position with respect to the elements 32, in particular with reference to the baffle 2W.

This has yielded surprising results in terms of performance of the elements 32, also using cartridge elements 32 that are commercially available and are not specifically designed to function in this way, this further confirming the quality of the conversion unit 1.

The conversion unit 1 may moreover be easily adapted to the requirements dictated by a vast number of applications.

In particular, it is possible to envisage solutions in which the kit of elements 32 is less numerous in so far as it is not necessary to process a (relatively) large flow of thermovector fluid in the second flow path F4.

In these situations, one or more pairs of holes 16H, 22H and 18H, 24H are occluded by plugs, and the plates 48, 50 and 48', 50' can be replaced by identical plates with recessed tracks that form a different electrical-connection scheme.

Furthermore, the thermal power that enters the unit 2 by energy exchange with the second thermovector fluid can be easily regulated via the valve BPV by controlling the amount of gas that enters the conversion unit 1. In particular, if the valve BPV is in a completely open position, the entire flow of the exhaust gases EGL will follow the normal route along the exhaust line of the vehicle without entering the unit 2, whereas, if the valve BPV is in a completely closed position, the entire flow will be sent on into the unit 2. The intermediate positions of the valve BPV determine, by fluid-dynamic equilibrium, the flow rate that enters the unit 2.

For this purpose, for a more effective monitoring the conversion unit 1 may be equipped with a set of sensors that comprises a sensor for detecting the temperature of the second thermovector fluid at inlet T4IN and a sensor for detecting the temperature of the second thermovector fluid at outlet T4OUT (FIG. 9).

As regards the first flow path F2, the set of sensors may comprise two sensors for detecting the temperature of the exhaust gases, one of which is set upstream and the other downstream of the valve BPV and which are designated by T_EGL_IN and T_EGL_OUT, respectively, whereas on the ports 2IN and 2OUT two temperature sensors T2IN and T2OUT may be arranged that monitor the temperature of the gas at inlet and at outlet, respectively, of the path F2, thus constituting a further control variable for operation of the valve BPV.

Of course, the details of construction and the embodiments may vary widely with respect to what has been described and illustrated herein, without thereby departing from the scope of the present invention, as defined in the annexed claims.

For instance, in the solution illustrated in the figures, the paths of flow F2 and F4 have directions of flow that correspond to a countercurrent operation of the energy-conversion unit 1, in order to maximize the efficiency of heat exchange. However, it is possible to provide a heat-exchange configuration in equicurrent in two alternative ways:
 by envisaging in the design stage a passage for the exhaust gases in the line EGL in an opposite direction (by swapping around the ports 2IN and 2OUT); or else
 by reversing the direction of flow of the second thermovector fluid in the path F4 (in this way, the manifold 36 would bear the port 4IN, whereas the manifold 34 would bear the port 4OUT).

Furthermore, in alternative embodiments, the electrodes 54 may be provided as female electrodes, and the electrodes 32E may be provided as male electrodes, simply by establishing a connection specular with respect to the one present in the embodiment represented in the figures.

What is claimed is:

1. A unit for conversion of thermal energy including:
 a first heat-exchange unit defining a first flow path for a first thermovector fluid; and a second heat-exchange unit defining a second flow path for a second thermovector fluid, wherein:

said first heat-exchange unit includes a first inlet port for said first thermovector fluid, and a first outlet port for said first thermovector fluid, said first inlet port and first outlet port being located on a same side of said first heat-exchange unit and having a baffle set therebetween so as to give a substantially "U"-shaped geometry to said first flow path;

said second heat-exchange unit includes a second inlet port and a second outlet port for said second thermovector fluid, and further includes a plurality of cartridge elements, said second flow path developing from said second inlet port, through said plurality of cartridge elements, to said second outlet port, said plurality of cartridge elements being at least partially immersed in the first flow path;

said plurality of cartridge elements are in fluid communication with a first manifold element and a second manifold element, which bear said second inlet port and said second outlet port, respectively;

each cartridge element of said plurality of cartridge elements includes an inlet orifice and an outlet orifice for said second thermovector fluid, a heat-exchange area for exchange of thermal energy between said second thermovector fluid and said first thermovector fluid, and a first electrode and a second electrode connected to at least one element made of thermoelectric material of the cartridge element; and wherein said first manifold element and said second manifold element each include a connection interface to said plurality of cartridge elements, which is configured for providing a hydraulic connection, respectively, with the inlet orifices and the outlet orifices of the plurality of cartridge elements, and an electrical connection, respectively, to the first electrodes and second electrodes of the plurality of cartridge elements.

2. The conversion unit according to claim 1, wherein said first manifold element and said second manifold element include electrical conductors electrically connected to electrodes configured for coupling with the first electrodes and the second electrodes, respectively, of the plurality of cartridge elements, wherein said electrical conductors provide an electrical connection of the elements made of thermoelectric material of said plurality of cartridge elements according to a pre-set scheme.

3. The conversion unit according to claim 2, wherein said first and second manifold elements are fixed to opposite longitudinal ends of a casing of said first heat-exchange unit.

4. The conversion unit according to claim 3, wherein the inlet orifices and the outlet orifices of the plurality of cartridge elements project outwards from said opposite longitudinal ends of said first heat-exchange unit and from said first flow path so as to couple with the corresponding connection interface on the first manifold element and on the second manifold element.

5. The conversion unit according to claim 4, wherein said casing includes a plurality of through holes provided at said opposite longitudinal ends and arranged coaxially with respect to one another so as to receive in pairs a corresponding cartridge element.

6. The conversion unit according to claim 5, wherein said casing includes a wall, which bears a first opening and a second opening that form said first inlet port and first outlet port, and wherein said baffle is a perforated plate set inside said casing in a position contiguous to said wall between said first and second openings, wherein the holes on said baffle have the same position with respect to corresponding pairs of holes in said opposite longitudinal ends so as to receive the corresponding cartridge elements.

7. The conversion unit according to claim 6, wherein said baffle includes a plurality of plates set alongside, and connected to, one another, wherein a perimeter of each plate has an alternation of shallow grooves and deep grooves, and wherein the holes on said baffle are obtained by coupling between a shallow groove and a deep groove of contiguous plates of the plurality of plates.

8. The conversion unit according to claim 7, wherein said plurality of plates set alongside one another includes three plates comprising a first peripheral plate, an intermediate plate, and a second peripheral plate.

9. The conversion unit according to claim 5, wherein each manifold element includes:

a head, which bears said second inlet port or said second outlet port, respectively;

a flange connected to said head and including a perforated diaphragm comprising a plurality of through holes, which have a same arrangement as the holes in a corresponding one of said opposite longitudinal ends of said casing, and each of which houses an annular gasket configured for receiving the inlet orifice or the outlet orifice, respectively, of the plurality of cartridge elements; and a first plate and a second plate, which are fixed to said flange, packed on one another, and have a plurality of through holes with a same arrangement as the through holes on said perforated diaphragm, in such a way that the inlet orifices and the outlet orifices are received in the through holes of the first plate and second plate packed on one another and in the annular gaskets housed in said perforated diaphragm, and wherein extending between pairs of through holes in the first plate and in the second plate are recessed tracks, which define, when they are set on top of one another, channels for housing said electrical conductors and said electrodes, which are configured for coupling, respectively, with the first electrodes and the second electrodes of the plurality of cartridge elements.

10. The conversion unit according to claim 9, wherein the electrodes in the channels defined by said recessed tracks are male electrodes, whereas the first electrodes and second electrodes of the plurality of cartridge elements are female electrodes configured for providing a mechanical snap fit with the male electrodes.

11. The conversion unit according to claim 9, wherein the electrodes in the channels defined by said recessed tracks are female electrodes, whereas the first electrodes and the second electrodes of the plurality of cartridge elements are male electrodes, said female electrodes being configured for providing a mechanical snap fit with the male electrodes.

12. The conversion unit according to claim 1, wherein said first flow path and said second flow path have flow directions that correspond to countercurrent operation.

13. The conversion unit according to claim 1, wherein said first flow path and said second flow path have flow directions that correspond to equicurrent operation.

14. A motor vehicle including an internal-combustion engine and a conversion unit according to claim 1, wherein:

said first inlet port and first outlet port branch off an exhaust line of said internal-combustion engine, said first thermovector fluid being exhaust gas of said internal-combustion engine;

said second inlet port and said second outlet port are in fluid communication with a cooling circuit of said internal-combustion engine, said second thermovector fluid being coolant of said internal-combustion engine; and said elements made of thermoelectric material are electrically connected to a DC/DC converter connected in parallel to an alternator, a battery, and an electrical wiring system of the motor vehicle.

\* \* \* \* \*